US012575065B2

(12) United States Patent
D'Incà et al.

(10) Patent No.: US 12,575,065 B2
(45) Date of Patent: Mar. 10, 2026

(54) HEAT SINK APPARATUS FOR AN INTERFACE MODULE

(71) Applicant: Telefonaktiebolaget LM Ericsson (PUBL), Stockholm (SE)

(72) Inventors: Claudio D'Incà, Genoa (IT); Gianni Paparella, Genoa (IT); Marco Assale, Genoa (IT); Sergio Lanzone, Genoa (IT); Sergio Mosti, Genoa (IT); Angelo Graci, Genoa (IT)

(73) Assignee: Telefonaktiebolaget LM Ericsson (PUBL), Stockholm (SE)

( * ) Notice: Subject to any disclaimer, the term of this patent is extended or adjusted under 35 U.S.C. 154(b) by 237 days.

(21) Appl. No.: 18/251,415

(22) PCT Filed: Nov. 4, 2020

(86) PCT No.: PCT/EP2020/081004
§ 371 (c)(1),
(2) Date: May 2, 2023

(87) PCT Pub. No.: WO2022/096090
PCT Pub. Date: May 12, 2022

(65) Prior Publication Data
US 2023/0413489 A1 Dec. 21, 2023

(51) Int. Cl.
*H05K 7/20* (2006.01)
*G02B 6/42* (2006.01)

(52) U.S. Cl.
CPC ....... *H05K 7/20418* (2013.01); *G02B 6/4269* (2013.01); *G02B 6/428* (2013.01)

(58) Field of Classification Search
CPC ................ G02B 6/4266–4273; H05K 7/20418
See application file for complete search history.

(56) References Cited

U.S. PATENT DOCUMENTS 9,983,370 B1 * 5/2018 Mahoney ............. G02B 6/4269
10,091,911 B2 * 10/2018 Kelty ................... G02B 6/4269
(Continued)

OTHER PUBLICATIONS

PCT Notification of Transmittal of the International Search Report and the Written Opinion of the International Searching Authority, or the Declaration issued for PCT/EP2020/081004—Jul. 23, 2021.

*Primary Examiner* — Robert J Hoffberg
(74) *Attorney, Agent, or Firm* — Baker Botts L.L.P.

(57) ABSTRACT

Embodiments described herein relate to apparatuses for reducing the effect of oscillations of a heat sink. A heat sink apparatus is provided for use with an interface module comprising a cage configured to receive a pluggable signal connector, wherein the cage comprises a first surface configured to couple to a circuit board. The heat sink apparatus comprises a heat sink, wherein the heat sink comprises: a first portion configured to couple into thermal contact with a second surface of the cage; a second portion, wherein the second portion is configured to extend beyond at least one of the dimensions of the cage in a plane parallel to the circuit board; a dampener coupled to the second portion of the heat sink, wherein the dampener is configured to dampen oscillations of the second portion in a direction perpendicular to the plane of the circuit board, and a first coupler coupled to the second portion of the heat sink for providing physical coupling between the heat sink and a second coupler on the circuit board during oscillations of the second portion in directions parallel to the plane of the circuit board.

15 Claims, 6 Drawing Sheets

(56) References Cited

U.S. PATENT DOCUMENTS

| | | | | |
|---|---|---|---|---|
| 10,121,727 | B1 | 11/2018 | Lucas et al. | |
| 10,777,939 | B2 * | 9/2020 | Lanzone | H01R 12/722 |
| 10,782,492 | B2 * | 9/2020 | Meunier | H05K 7/2049 |
| 10,856,055 | B2 * | 12/2020 | Weltsch | H05K 7/20772 |
| 10,910,766 | B2 * | 2/2021 | D'Inca | G02B 6/4261 |
| 11,143,830 | B2 * | 10/2021 | Luo | G02B 6/4278 |
| 11,480,747 | B2 * | 10/2022 | Wang | G02B 6/423 |
| 12,292,606 | B2 * | 5/2025 | Assale | G02B 6/4271 |
| 2019/0273339 | A1 | 9/2019 | Lanzone et al. | |
| 2020/0142142 | A1 | 5/2020 | Luo et al. | |
| 2020/0257067 | A1 | 8/2020 | Meunier et al. | |
| 2020/0304889 | A1 * | 9/2020 | Weltsch | H05K 7/20772 |

* cited by examiner

HEAT SINK APPARATUS FOR AN INTERFACE MODULE

PRIORITY

This nonprovisional application is a U.S. National Stage Filing under 35 U.S.C. § 371 of International Patent Application Serial No. PCT/EP2020/081004 filed Nov. 4, 2020 and entitled "A HEAT SINK APPARATUS FOR AN INTERFACE MODULE" which is hereby incorporated by reference in its entirety.

TECHNICAL FIELD

The present disclosure relates to the field of connectors, such as heat sinks for connectors or an interface module, e.g. electrical or optical connectors or interface modules.

BACKGROUND

Typical connector systems include a cable assembly and a connector mounted on a board such as a printed circuit board (PCB). The cable assembly, which commonly includes a pair of plug connectors on opposite ends of a cable, is configured to transmit signals over a certain distance. The board-mounted connector may comprise a receptacle, or cage, configured to receive and mate with one of the plug connectors, ensuring a secure connection between the cable assembly and an interface on the board. A signal (such as an electrical or optical signal) may thus be received at the interface via the cable, or transmitted from the interface via the cable.

One issue that has arisen in the development of such connector systems is the build-up of heat in and around the receptacle. This problem is particularly pronounced for active cable assemblies (i.e. cables having embedded circuitry to boost their performance). In order to address this problem, heat sinks have been used to dissipate the heat that builds up in the connector.

New Pluggable modules, for example QSFPDD modules, may generate such a large quantity of heat (~20 Watts) that it may only be effectively dissipated with a heat sink that has dimensions that exceeds the ones of the surface of the cage.

FIG. 1a is a schematic diagram of an interface module 100 and a heat sink 110, shown in cross section. The interface module 100 may be suitable for use in a larger apparatus, such as a computer system, a server, or another network component, for inputting or outputting signals via an electrical or optical cable assembly.

The module 100 comprises a housing 102, which substantially encloses and surrounds the internal components of the module 100. A printed circuitry board (PCB) 104 is fixed to one internal surface of the housing 102, and a cage or receptacle 106 is fixed to the PCB 104. The cage 106 is hollow, and comprises an opening, a rear face opposite the opening, and a main body extending between the opening and the rear face. The opening is aligned with a corresponding opening in the housing 102, such that a connector (e.g. a connector for a cable assembly) can be inserted through the opening, and is guided towards the rear of the cage by the main body. The cage 106 may define an internal space or bore, having a cross section that complements the cross section of the connector, so as to guide the connector accurately to an interface 108 that is positioned towards the rear of the cage 106. When the connector is fully inserted in the cage 106, it mates with the interface 108 such that signals can pass from the connector to the PCB 104 via the interface 108, or from the PCB 104 to the connector via the interface 108.

In order to dissipate excess heat that may build up in the connector while in use, a heat sink 110 is provided that extends over an upper surface of the cage 106. In the illustration the heat sink 110 is coupled to the cage 106 by a clip 114. The clip may couple the heat sink to the cage by a snap fixing system 116. It will be appreciated that the heat sink 110 may be coupled to the cage 106 in any suitable manner. The heat sink 110 may be manufactured from a material having a high thermal conductivity, and may comprise one or more fins or other features designed to dissipate heat.

FIG. 1b is a three dimensional illustration of a heat sink and an interface module. The cage comprises a first surface 120 configured to couple with a circuit board (e.g. circuit board 104 illustrated in FIG. 1a). The heat sink 100 comprises a first portion 122 configured to couple into thermal contact a second surface 112 (e.g. the surface opposite the surface coupled to the PCB or circuit board) of the cage 106; and a second portion 124, wherein the second portion 124 is configured to extend beyond at least one of the dimensions of the cage 106 in a plane parallel to the circuit board.

SUMMARY

According to some embodiments there is provided a heat sink apparatus for use with an interface module comprising a cage configured to receive a pluggable signal connector, wherein the cage comprises a first surface configured to couple to a circuit board. The heat sink apparatus comprises a heat sink, wherein the heat sink comprises: a first portion configured to couple into thermal contact with a second surface of the cage; a second portion, wherein the second portion is configured to extend beyond at least one of the dimensions of the cage in a plane parallel to the circuit board; a dampener coupled to the second portion of the heat sink, wherein the dampener is configured to dampen oscillations of the second portion in a direction perpendicular to the plane of the circuit board, and a first coupler coupled to the second portion of the heat sink for providing physical coupling between the heat sink and a second coupler on the circuit board during oscillations of the second portion in directions parallel to the plane of the circuit board.

According to some embodiments there is provided a system comprising a heat sink apparatus according as described above, the interface module and the circuit board.

According to some embodiments there is provided a system. The system comprises an interface module. The interface module comprises a cage for receipt of a pluggable signal connector, wherein a first surface of the cage is configured to be coupled to a circuit board; and a heat sink apparatus. The heat sink apparatus comprises a heat sink, wherein a first portion of the heat sink is in thermal contact with a second surface of the cage, and a second portion of the heat sink extends beyond at least one of the dimensions of the cage in a plane parallel to the circuit board; and a dampener coupled to the second portion of the heat sink to dampen oscillations of the second portion in a direction perpendicular to the circuit board.

According to some embodiments there is provided a system. The system comprises an interface module. The interface module comprises a cage for receipt of a pluggable signal connector wherein a first surface of the cage is configured to be coupled to a circuit board; and a heat sink apparatus. The heat sink apparatus comprises a heat sink, wherein a first portion of the heat sink is in thermal contact
with a second surface of the cage, and a second portion of
the heat sink extends beyond at least one of the dimensions
of the cage in a plane parallel to the circuit board; and a first
coupler coupled to the second portion of the heat sink for
providing physical coupling between the heat sink and a
second coupler first coupler on the circuit board during
oscillations of the second portion in directions parallel to the
plane of the circuit board.

BRIEF DESCRIPTION OF THE DRAWINGS

For a better understanding of the embodiments of the
present disclosure, and to show how it may be put into effect,
reference will now be made, by way of example only, to the
accompanying drawings, in which.

DESCRIPTION

Generally, all terms used herein are to be interpreted
according to their ordinary meaning in the relevant technical
field, unless a different meaning is clearly given and/or is
implied from the context in which it is used. All references
to a/an/the element, apparatus, component, means, step, etc.
are to be interpreted openly as referring to at least one
instance of the element, apparatus, component, means, step,
etc., unless explicitly stated otherwise. The steps of any
methods disclosed herein do not have to be performed in the
exact order disclosed, unless a step is explicitly described as
following or preceding another step and/or where it is
implicit that a step must follow or precede another step. Any
feature of any of the embodiments disclosed herein may be
applied to any other embodiment, wherever appropriate.
Likewise, any advantage of any of the embodiments may
apply to any other embodiments, and vice versa. Other
objectives, features and advantages of the enclosed embodi-
ments will be apparent from the following description.

Embodiments described herein relate to a heat sink appa-
ratus, an interface module comprises a heat sink and a
system comprise a heat sink apparatus, an interface module
and a circuit board.

Figure 1A:
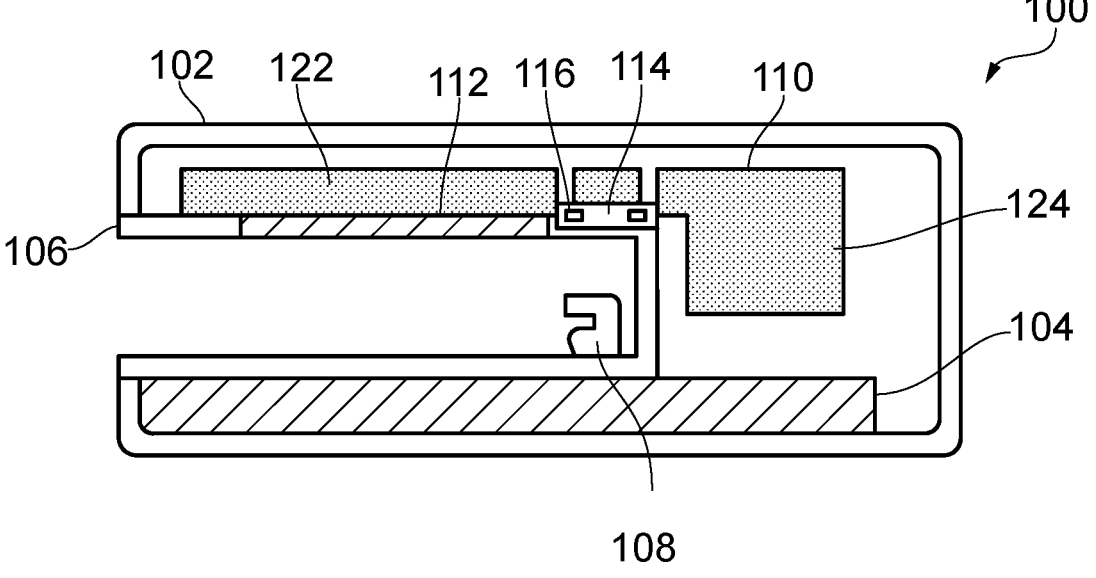
FIG. 1a is a schematic diagram of an interface module
100 and a heat sink 110, shown in cross section.
Figure 1B:
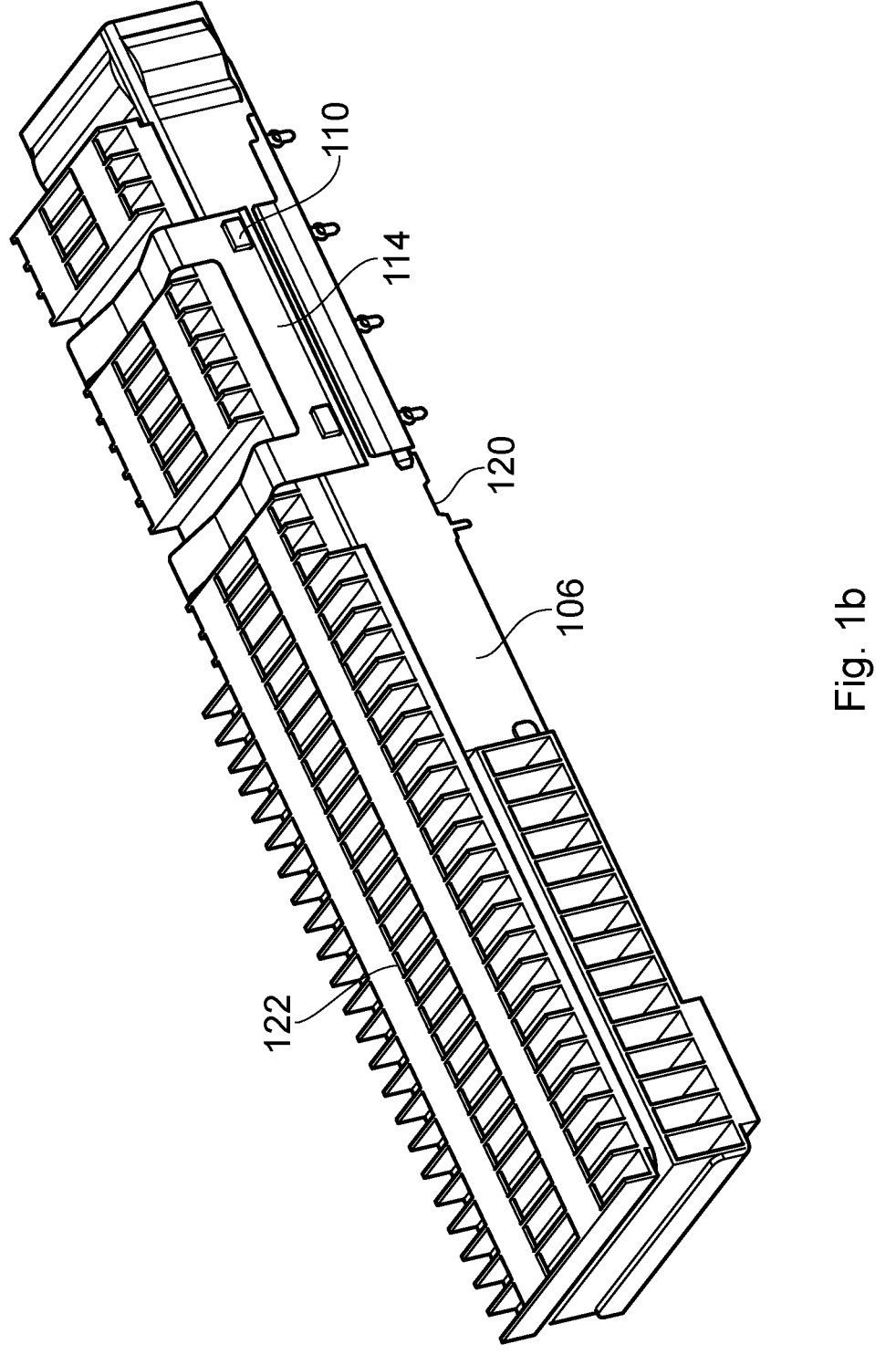
FIG. 1b illustrates a three dimensional illustration of a
heat sink and an interface module.

As illustrated in FIG. 1b, in some examples a heat sink
apparatus comprises a heat sink with a first portion 122
configured to couple into thermal contact a second surface
112 (e.g. the surface opposite the surface coupled to the PCB
or circuit board) of the cage 106; and a second portion,
wherein the second portion is configured to extend beyond
at least one of the dimensions of the cage in a plane parallel
to the circuit board. As used herein, the term circuit board
may be understood to refer to any suitable substrate or
surface that the interface module is coupled to.

In embodiments described herein, the second portion of
the heat sink is not fixed to the circuit board. In equilibrium,
there is a gap between the circuit board and the second
portion of the heat sink. For example, the gap may measure
around 2 mm when the pluggable module is not inserted into
the cage. As the pluggable module is inserted into the cage
the cage may expand and the gap may increase slightly, for
example by 0.75 mm to 0.85 mm.

The gap between the circuit board and the heat sink may
increase airflow around the heat sink and therefore improve
the heat dissipation.

However, in some situations the system comprising the
cage, heat sink and circuit board may be in an uncontrolled
environment in which the system is subject to oscillations,
for example during transit. If the system is shaken in such an
environment, there may be accidental release of the snap
fixing system 116 which may release and/or damage the heat
sink. Oscillations in a plane parallel to the circuit board may
also cause the heat sink to collide with one or more other
components coupled to the circuit board, which may cause
further damage to the heatsink and/or the one or more other
components.

It may therefore be beneficial to control the potential
movement of the heat sink when in an uncontrolled envi-
ronment to avoid oscillations that may cause undue damage.

Figure 2:
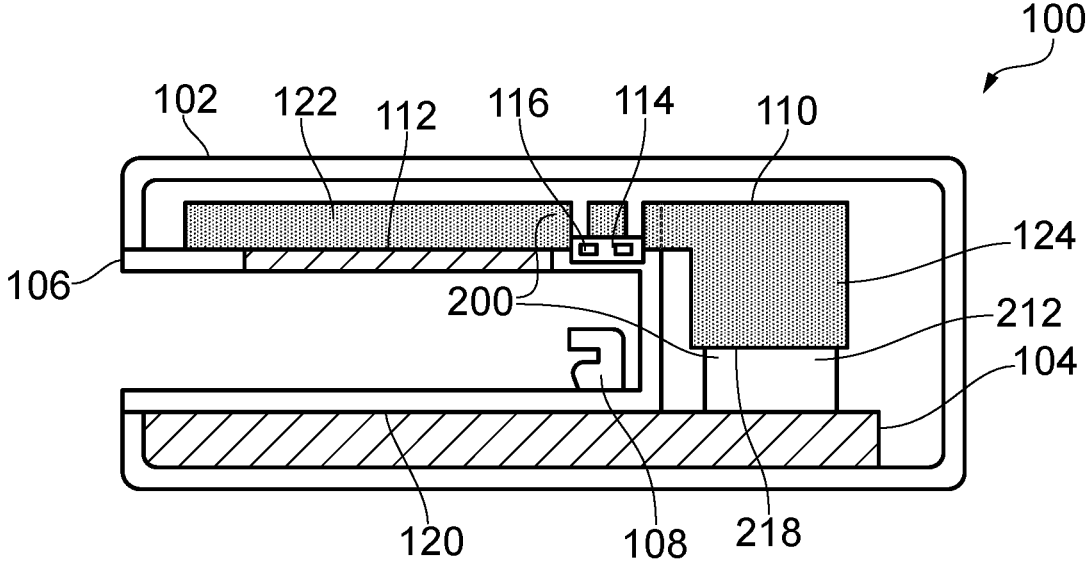
FIG. 2 is a schematic diagram of a heat sink apparatus for
use with an interface module comprising a cage configured
to receive a pluggable signal connector.

FIG. 2 is a schematic diagram of a heat sink apparatus 200
for use with an interface module comprising a cage 106
configured to receive a pluggable signal connector. For
example, the signal connector may comprise one of: an
optical connector, an electrical connector, or an electro-optic
connector. The signal connector may comprise a small
form-factor pluggable, SFP/QSFP connector (or other plug-
gable signal connector, for example, XFP or CFP). The cage
106 comprises a first surface 120 configured to couple to a
circuit board 104.

In this embodiment the heat sink apparatus comprises a
heat sink 110. The heat sink 110 may be configured to couple
to the cage 106 via a clip with a snap fixing mechanism. The
heat sink 110 comprises wherein a first portion 122 which is
in thermal contact with a second surface of the cage, and a
second portion 124 which extends beyond at least one of the
dimensions of the cage in a plane parallel to the circuit
board. It will be appreciated that many different shapes of
heat sink may be used. The heat sink overhangs the cage
106, i.e. extends beyond the area of the cage 106 in the plane
of the circuit board. The heat sink is attached to the cage
such that there is a gap between the heat sink 110 and the
circuit board 104, as described with reference to FIG. 1a. As
such, the second portion of the heat sink is spaced apart from
the circuit board.

In some embodiments, the heat sink apparatus 200 further
comprises a dampener 212 coupled to the second portion
124 of the heat sink 110 to dampen oscillations of the second
portion 124 in a direction perpendicular to the circuit board
104. The dampening of oscillations in this manner may
avoid oscillations that may cause the clip to unfasten or
damage to occur to the heat sink 110 whilst also allowing for
enough movement of the heat sink in the direction perpen-
dicular to the circuit board 104 to allow for a pluggable
module to be inserted into the cage 106.

The dampener 212 may be coupled to a first surface 218
of the second portion 124 of the heat sink for positioning
between the circuit board 104 and the heat sink 110. The first
surface 218 of the second portion 124 is at least partially
covered by the dampener 212. This positioning means that
as the second portion 124 oscillates in a direction perpen-
dicular to the circuit board 104, the dampener 212 may come into contact with the circuit board 104, and may absorb some of the energy of the oscillations thereby reducing the magnitude of the oscillations. In some aspects, the dampener is configured to compress as the heat sink moves towards the circuit board, such that movement of the heat sink is reduced or damped. In this example, the dampener 212 is in contact with both the circuit board 104 and the heat sink 110.

The dampener may be considered as a resilient material. The resilient material is located to be compressed between the circuit board 104 and the heat sink 110 by relative motion of the second portion of the heat sink toward the circuit board, i.e. in a plane perpendicular to the circuit board. Thus, the dampener reduces the amount of movement between the second portion of the heat sink and the circuit board. In some examples the dampener is in contact with both the heat sink and circuit board. In other examples, there may be a small gap between the dampener and the circuit board. The gap may be small enough such that the dampener comes into contact with the circuit board when the heat sink starts to oscillate.

In order to absorb the energy of the oscillations, the dampener 212 may be made of an energy absorbent material such as a resilient material, e.g. a rubber material, foamed material or a rubbery material. The resilient material may alternatively be considered as deformable or resiliently deformable. The deformable or energy absorbing material used for the dampener 212 is configured to dampen oscillations of the second portion in a direction perpendicular to the plane of the circuit board. Alternatively, the damping effect may be achieved with movement or strain on mechanical components. For example, the dampener may be made from a resilient spring or deforming fingers.

In some examples, the dampener 212 comprises a plurality of layers, and wherein the plurality of layers are coupled to the first surface of the second portion such that one or more air channels are formed between the plurality of layers. In some examples the dampener comprises a perforated or gas-permeable material. In some examples, the dampener 212 comprises strips of material coupled to the first surface 218 with gaps in between. The gaps in between the strips may allow for better airflow improving the heat dissipation of the heat sink 110.

Figure 3A:
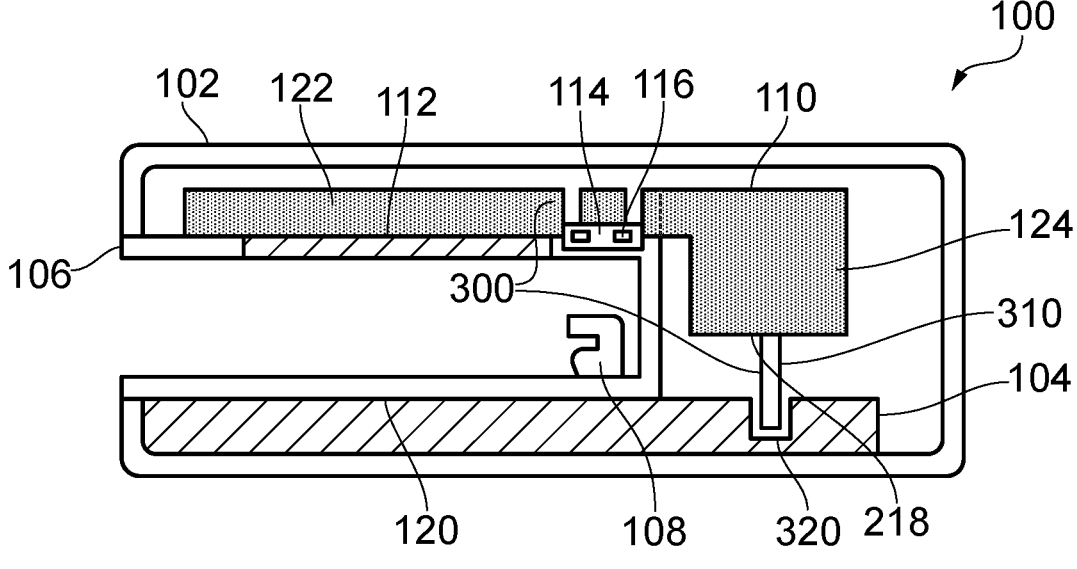
FIG. 3a is a schematic diagram of a heat sink apparatus
for use with an interface module comprising a cage config-
ured to receive a pluggable signal connector.

FIG. 3*a* is a schematic diagram of a heat sink apparatus 300 for use with an interface module comprising a cage 106 configured to receive a pluggable signal connector. The cage 106 comprises a first surface 210 configured to couple to a circuit board 104.

Similarly to as in FIG. 2, the heat sink apparatus 300 comprises a heat sink 110. The heat sink 110 may be configured to couple to the cage via a clip with a snap fixing mechanism as illustrated in FIG. 1. The heat sink 110 comprises wherein a first portion 122 which is in thermal contact with a second surface of the cage, and a second portion 124 which extends beyond at least one of the dimensions of the cage in a plane parallel to the circuit board. It will be appreciated that many different shapes of heat sink may be used. The heat sink may however over hang the cage 106 (i.e. be spaced apart) when in use such that there is a gap between the heat sink 110 and the circuit board 104 as described with reference to FIG. 1.

In this embodiment, the heat sink apparatus 300 further comprises a first coupler 310 coupled to the second portion 124 of the heat sink 110 for providing physical coupling between the heat sink 110 and a second coupler 320 on the circuit board during oscillations of the second portion 124 in directions parallel to the plane of the circuit board 104. The engagement of the first coupler and second coupler restricts relative movement between the heat sink and the circuit board in a direction parallel to the plane of the circuit board. For example, the engagement of the first coupler and second coupler prevents excessive movement, or limits movement, between the heat sink and circuit board in a direction parallel to the plane of the circuit board. For example, the engagement of the first coupler and second coupler limits movement in all directions parallel to the plane of the circuit board.

In this example, the first coupler 310 comprises a protrusion extending from the second portion 124 of the heat sink 110, and the second coupler 312 comprises an opening in the circuit board that is configured to engage with the protrusion.

The first coupler and second coupler are configured to allow movement between the second portion of the heat sink and circuit board in a direction perpendicular to the plane of the circuit board.

In some examples, the protrusion is a cylindrical shape. The opening in the circuit board may be circular. The protrusion may take other shapes, e.g. having a square or hexagonal profile, and/or may be of uniform profile or be tapered. The opening or recess may have a complementary shape, or may have a non-complementary shape which defines surfaces to limit movement of the heat sink in directions parallel to the plane of the circuit board. The protrusion and opening may alternatively be considered as engaging male and female parts.

In some examples, the second coupler is an aperture in the circuit board, such that the protrusion of the first coupler extends into the aperture. The aperture is dimensioned to be slightly larger than the protrusion, such that the protrusion can freely enter the aperture, but engagement with surfaces defined by the aperture, i.e. surfaces of the circuit board, restrict or prevent movement in the plane of the circuit board. As such, the circuit board itself provides the second coupler, i.e. without any additional element attached to it. In other examples, the second coupler is attached to the circuit board. The second coupler defines an aperture, e.g. as a cup shape, into which the first coupler engages, as described above.

Figure 3B:
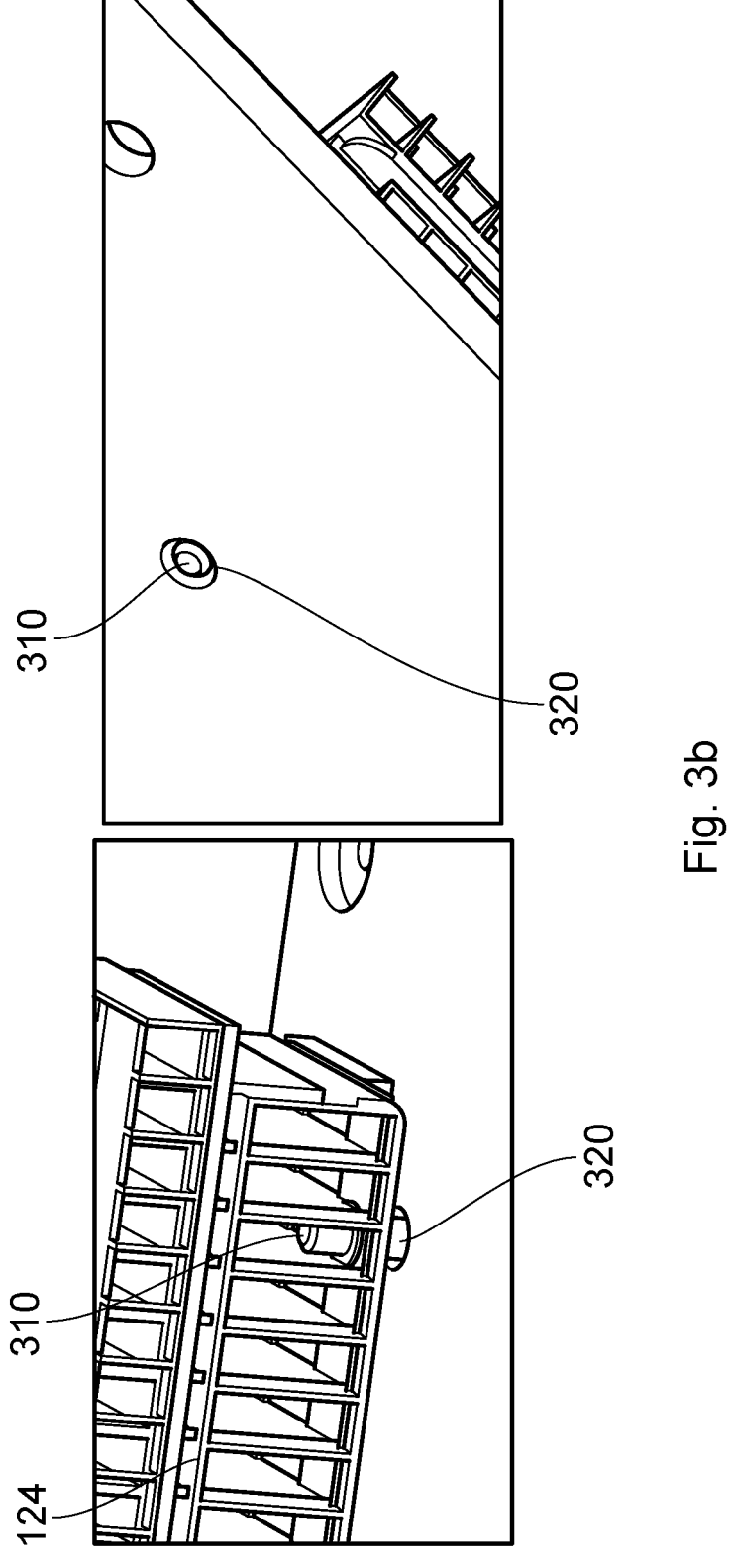
FIG. 3b is a three dimensional illustration of the first
coupler and second coupler.

It will be appreciated that any suitable of first coupler and second coupler may be used. For example, the first coupler 310 may comprise an opening in the heat sink 110 and the second coupler 320 may comprise a protrusion on the circuit board. FIG. 3*b* is a three dimensional illustration of the first coupler and the second coupler in this embodiment.

Alternatively, the first coupler 310 and the second coupler 320 may comprise an element coupled to second portion of the heat sink comprising an opening, for example a hole down the axis of the element perpendicular to the plane of the circuit board, and a protrusion extending from the circuit board having a smaller cross-sectional area than the first protrusion, where the protrusion is configured to fit within the hole of the element. It will be appreciated that the element may instead be coupled to the circuit board and the protrusion may be coupled to the second portion of the heat sink.

In some examples, the first coupler 310 and the second coupler 320 may be designed such that they are engaged into a functioning position upon attachment of the heat sink 110 to the cage 106 which is coupled to the circuit board, without requiring any further steps. For example, the heat sink attaches to the cage in the same direction as the first coupler is coupled to the second coupler.

In some examples the first coupler and second coupler may allow for oscillations of the heat sink in the direction perpendicular to the circuit board 104 to occur, in order to allow for the expansion of the cage 106 on insertion of a pluggable connector into the cage 106.

By coupling the second portion 124 of the heat sink 110 to the circuit board 104 in this manner, oscillations in the direction parallel to the circuit board 104 may be reduced. For example, considering the example in which the first coupler comprises a protrusion and the second coupler comprises a hole in the circuit board, as illustrated in FIG. 3*a*, the first coupler and second coupler may be designed such that the protrusion 310 sits completely within the opening 320, without making contact with the circuit board 104 during equilibrium (e.g. when the heat sink 110 is not oscillating). Then as the heat sink 110 oscillates in a direction parallel to the circuit board 104, the protrusion 310 may come into contact with the circuit board 104, thereby preventing the oscillations of the heat sink 110 from reaching too great a magnitude (e.g. a magnitude which would release the heat sink), and protecting any components that may be coupled to the circuit board 104 either side of the heat sink 110.

In some examples, the protrusion 310 may be formed from dampening or resilient material configured to dampen the oscillations parallel to the plane of the circuit board. By utilising dampening material to form the protrusion, more energy may be absorbed by the protrusion in stopping the oscillation of the heat sink, thereby preventing damage to the heat sink 110 and/or circuit board.

Figure 4:
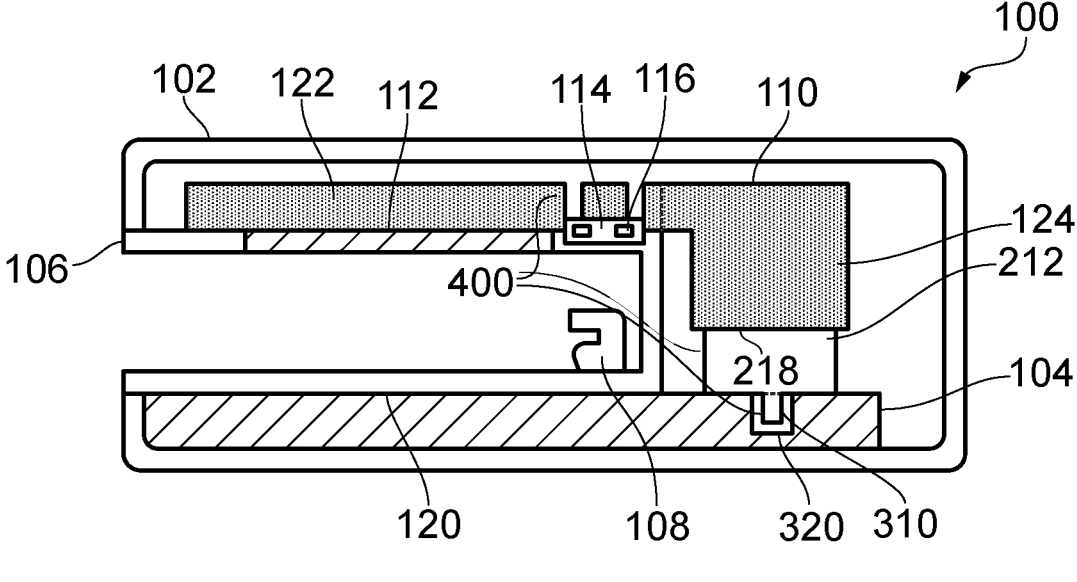
FIG. 4 is a schematic diagram of a heat sink apparatus for
use with an interface module comprising a cage configured
to receive a pluggable signal connector.

FIG. 4 illustrates a heat sink apparatus 400 for use with an interface module comprising a cage 106 configured to receive a pluggable signal connector.

In this embodiment the heat sink apparatus 400 comprises both a dampener 212 and a first coupler 310 as described with reference to FIGS. 2, 3*a* and 3*b*.

In some examples, the dampener 212 and the first coupler 310 may be formed from the same piece of material. For example a single piece of material may be provided having an area for contacting the circuit board 104 when oscillations in the direction perpendicular to the circuit board 104 occur, as well as a protrusion 310 (or in some examples an opening) for coupling with an opening (or a protrusion) in the circuit board 104 when oscillations in a direction parallel to the circuit board 104 occur. Forming the dampener 212 and the first coupler 310 from the same piece of material provides for easier manufacture of the heat sink apparatus 400.

In some examples a system is provided comprising a heat sink apparatus as described with reference to any of FIGS. 2 to 4 along with an interface module. In some examples the system further comprises the circuit board 104.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A heat sink apparatus for use with an interface module comprising a cage configured to receive a pluggable signal connector, wherein the cage comprises a first surface configured to couple to a circuit board, the heat sink apparatus comprising:

a heat sink, wherein the heat sink comprises:

a first portion configured to couple into thermal contact with a second surface of the cage;

a second portion, wherein the second portion is configured to extend beyond at least one of dimensions of the cage in a plane parallel to the circuit board;

a dampener coupled to the second portion of the heat sink, wherein the dampener is configured to dampen oscillations of the second portion in a direction perpendicular to a plane of the circuit board, and a first coupler coupled to the second portion of the heat sink for providing physical coupling between the heat sink and a second coupler in or on the circuit board during the oscillations of the second portion in a direction parallel to the plane of the circuit board, wherein an engagement of the first coupler and the second coupler is configured to allow movement between the second portion of the heat sink in a direction perpendicular to the plane of the circuit board, and wherein the engagement of the first coupler and the second coupler is configured to restrict relative movement between the heat sink and the circuit board in the direction parallel to the plane of the circuit board.

2. The heat sink apparatus according to claim 1, wherein the dampener is coupled to a first surface of the second portion for positioning between the circuit board and the heat sink, wherein the first surface of the second portion is at least partially covered by the dampener.

3. The heat sink apparatus according to claim 2, wherein the dampener comprises a plurality of layers, and wherein the plurality of layers are coupled to the first surface of the second portion such that one or more air channels are formed by the plurality of layers.

4. The heat sink apparatus according to claim 1 wherein the dampener is formed from a deformable material.

5. The heat sink apparatus according to claim 1, wherein:

the first coupler comprises a first protrusion extending from the second portion of the heat sink, and the second coupler comprises a first opening in either the circuit board or in a first element coupled to the circuit board that is configured to engage with the first protrusion; or the first coupler comprises a second opening within either the second portion of the heat sink or in a second element coupled to the second portion, and the second coupler comprises a second protrusion extending from the circuit board that is configured to engage with the second opening.

6. The heat sink apparatus according to claim 5, wherein the first protrusion or the second protrusion is formed from a dampening material configured to dampen the oscillations of the second portion in the direction parallel to the plane of the circuit board.

7. The heat sink apparatus according to claim 1, wherein the dampener and the first coupler are formed from a same piece of material.

8. A system comprising:

the heat sink apparatus according to claim 1, the interface module and the circuit board.

9. A system comprising:

an interface module, comprising:

a cage for receipt of a pluggable signal connector, wherein a first surface of the cage is configured to be coupled to a circuit board; and a heat sink apparatus comprising:

a heat sink, wherein a first portion of the heat sink is in thermal contact with a second surface of the cage, and a second portion of the heat sink extends beyond at least one of dimensions of the cage in a plane parallel to the circuit board;

a dampener coupled to the second portion of the heat sink to dampen oscillations of the second portion in a direction perpendicular to the circuit board; and a first coupler coupled to the second portion of the heat sink for providing physical coupling between the heat sink and a second coupler in or on the circuit board during oscillations of the second portion in a direction parallel to a plane of the circuit board, wherein an engagement of the first coupler and the second coupler is configured to allow movement between the second portion of the heat sink in a direction perpendicular to the plane of the circuit board, and wherein the engagement of the first coupler and the second coupler is configured to restrict relative movement between the heat sink and the circuit board in the direction parallel to the plane of the circuit board.

10. The system according to claim 9, wherein the dampener is coupled to a first surface of the second portion for positioning between the circuit board and the heat sink, wherein the first surface of the second portion is at least partially covered by the dampener.

11. The system according to claim 10, wherein the dampener comprises a plurality of layers, and wherein the plurality of layers are coupled to the first surface of the second portion such that one or more air channels are formed by the plurality of layers.

12. The system according to claim 9, wherein the dampener is formed from a deformable material.

13. The system according to claim 9, wherein:

the first coupler comprises a first protrusion extending from the second portion of the heat sink, and the second coupler comprises a first opening in either the circuit board or in a first element coupled to the circuit board that is configured to engage with the first protrusion; or the first coupler comprises a second opening within either the second portion of the heat sink or in a second element coupled to the second portion, and the second coupler comprises a second protrusion extending from the circuit board that is configured to engage with the second opening.

14. The system according to claim 13, wherein the first protrusion or the second protrusion is formed from a dampening material configured to dampen the oscillations of the second portion in the direction parallel to the plane of the circuit board.

15. The system according to claim 9, wherein the dampener and the first coupler are formed from a same piece of material.

* * * * *